US012518951B2

(12) United States Patent
Choi et al.

(10) Patent No.: US 12,518,951 B2
(45) **Date of Patent: *Jan. 6, 2026**

(54) COOLING BLOCK AND PLASMA REACTOR HAVING SAME

(71) Applicant: NEW POWER PLASMA CO., LTD., Suwon-si (KR)

(72) Inventors: Dai Kyu Choi, Seoul (KR); Eun Seok Lim, Suwon-si (KR)

(73) Assignee: NEW POWER PLASMA CO., LTD., Suwon-si (KR)

(*) Notice: Subject to any disclaimer, the term of this patent is extended or adjusted under 35 U.S.C. 154(b) by 475 days.

This patent is subject to a terminal disclaimer.

(21) Appl. No.: 18/010,551

(22) PCT Filed: Jul. 29, 2020

(86) PCT No.: PCT/KR2020/010008
§ 371 (c)(1),
(2) Date: Dec. 15, 2022

(87) PCT Pub. No.: WO2021/256607
PCT Pub. Date: Dec. 23, 2021

(65) Prior Publication Data

US 2023/0260762 A1 Aug. 17, 2023

(30) Foreign Application Priority Data

Jun. 16, 2020 (KR) ........................ 10-2020-0073080

(51) Int. Cl.
*H01J 37/32* (2006.01)

(52) U.S. Cl.
CPC .. *H01J 37/32522* (2013.01); *H01J 37/32669* (2013.01)

(58) Field of Classification Search
CPC .... H01J 37/32357; H01J 37/32; H01J 37/321; H01J 37/32669; H01J 37/32522
(Continued)

(56) References Cited

U.S. PATENT DOCUMENTS 6,776,879 B2 8/2004 Yamamoto et al.
8,182,661 B2 * 5/2012 Tanase ................ C23C 14/3407 204/192.12
9,960,011 B2 5/2018 Lee et al.

FOREIGN PATENT DOCUMENTS

JP 2002-220661 A 8/2002
JP 2018-107102 A 7/2018
(Continued)

*Primary Examiner* — Rodney G McDonald
(74) *Attorney, Agent, or Firm* — Bridgeway IP Law Group, PLLC; Sang Ho Lee; Hyun Woo Shin

(57) ABSTRACT

Provided are a cooling block that can be easily manufactured by forming vertical or horizontal flow paths in an integrated single block body through drilling, and a plasma reaction device having same, and may include: an integrated block body; a first vertical flow path formed in a vertical shape by passing through the inside of the block body from one surface of the block body; a first horizontal flow path passing through one portion of the first vertical flow path; a second horizontal flow path passing through the other portion of the first vertical flow path; a second vertical flow path passing through the first horizontal flow path and the second horizontal flow path; a first sealing stopper provided at a first point so that a refrigerant, having passed through the first vertical flow path, can branch in two ways and then merge into the second vertical flow path; and a second sealing stopper provided at a second point.

8 Claims, 5 Drawing Sheets

(58) Field of Classification Search
USPC .................................... 204/298.09; 118/724
See application file for complete search history.

(56) References Cited

FOREIGN PATENT DOCUMENTS

| | | | |
|---|---|---|---|
| KR | 10-2002-0063519 | A | 8/2002 |
| KR | 10-1321085 | B1 | 10/2013 |
| KR | 10-2016-0039856 | A | 4/2016 |
| KR | 10-2016-0129304 | A | 11/2016 |
| KR | 10-1950027 | B1 | 2/2019 |
| WO | 2013-018998 | A1 | 2/2013 |

* cited by examiner (a)

(b)

COOLING BLOCK AND PLASMA REACTOR HAVING SAME

TECHNICAL FIELD

The present invention relates to a cooling block and a plasma reactor having the same, and more particularly, to a cooling block that can be easily manufactured by forming vertical or horizontal flow paths in an integrated single block body through drilling and a plasma reactor having the same.

BACKGROUND ART

Plasma discharge is used for gas excitation to generate an active gas including ions, free radicals, atoms and molecules. An active gas is widely used in various fields. An active gas is generally used in semiconductor fabrication processes, for example, such as etching, deposition, cleaning, ashing, and the like.

Recently, a wafer or a liquid crystal display (LCD) glass substrate for manufacturing a semiconductor device becomes larger. However, there is a need of an easily extensible plasma source having a high capability for controlling of plasma ion energy and a capability for processing a large area.

It is known that remotely using the plasma is very useful in the process of manufacturing the semiconductor using plasma.

For example, the remote use of the plasma has been usefully used in a cleaning of a process chamber or an ashing process for a photoresist strip. However, since a volume of the process chamber increases according to the enlargement of a substrate to be processed, a plasma source capable of remotely and sufficiently supplying high-density activated gas has been demanded.

In the meantime, a remote plasma reactor (or remote plasma generator) uses a transformer coupled plasma source or an inductively coupled plasma source. The remote plasma reactor using the transformer coupled plasma source has a structure in which a magnetic core having a first winding coil is mounted a reactor body having a toroidal structure. The remote plasma reactor using the inductively coupled plasma source has a structure in which an inductively coupled antenna is mounted in a reactor body having a hollow tube structure.

For example, a gas injected into the plasma reactor makes a gaseous material into a plasma form containing ions, free radicals, atoms, and molecules by electrical force, and the plasma is used at a distance for various purposes such as etching, deposition, cleaning, or the like.

As described in Korean Patent Application Publication No. 10-2016-0129304, technology of a conventional plasma reactor including a cooling kit on a magnetic core where an induced electromotive force is generated to prevent overheating of the magnetic core and reduce power loss has been developed.

The conventional plasma reactor is fabricated as a two-piece type reactor in which the cooling block for circulating cooling water is formed of two plates, and a flow path is formed on an inner surface of each of the two plates or an inner surface of one plate, and then two plates are brought into close contact with each other with a sealing member interposed therebetween to seal together.

However, the cooling block manufactured as such a two-piece type requires a large amount of cost and time to separately manufacture each plate, and even if a sealing member is provided between the two plates, refrigerant leaks frequently occur due to poor sealing capability. Also, since a plurality of screws, bolts, or nuts are required to attach the plates to each other, the manufacturing time and cost are greatly increased, and a boundary phenomenon in which the heat transfer efficiency is reduced at the interface between the two plates occurs, resulting in great reduction of the heat transfer efficiency.

Meanwhile, cooling lines of the cooling water are not uniformly formed outside and inside a reactor body and a magnetic core, cooling efficiency is significantly reduced due to failing to use the phenomenon of natural convention caused by the difference in density due to the expansion of heated cooling water, and the flow rate, temperature, and pressure of the cooling water cannot be accurately controlled, leading to deterioration in plasma generation efficiency.

In addition, in the conventional plasma reactor, when no plasma is generated, that is, even in standby mode, the cooling water flows the same as in plasma mode, so that the reactor is rapidly overcooled in a state where a plasma heating source disappears, whereby particles are generated inside or an ignition failure phenomenon or a plasma maintenance failure phenomenon occurs due to a decrease in the temperature of the reactor body when the plasma is ignited.

DETAILED DESCRIPTION OF THE INVENTION

Technical Problem

The present invention is to solve various problems including the aforementioned problems and to provide a cooling block and a plasma reactor including the same, which can easily fabricate a flow path in a complicated shape into one piece by forming vertical or horizontal flow paths in an integrated single block body through gun drilling or the like and blocking an unnecessary part with a stopper, thereby greatly reducing manufacturing cost and time, also can prevent refrigerant leaks by using a stopper with excellent sealing capability instead of a sealing member, does not require separate fixtures due to the integrated shape, thus further reducing manufacturing processes or time and costs, and can greatly improve the heat transfer efficiency since a boundary phenomenon does not occur.

Further, the present invention aims to provide a cooling block and a plasma reactor having the same, which can maximize the cooling efficiency by inducing the flow of cooling water downward in a cooling block of a relatively low temperature so as to be opposite to thermal convection and inducing the flow of the cooling water upward in a reactor body of a relatively high temperature so as to conform to thermal convection, can prevent the generation of particles by preventing overcooling of the reactor body or a magnetic core by reducing the flow rate of the cooling water, raising the temperature of the cooling water, or reducing the pressure in a standby mode, and can increase the plasma ignition rate and retention rate. However, these objectives are merely exemplary and are not intended to limit the scope of the present invention.

Technical Solution

A cooling block according to the present invention for solving the above problems may include an integrated block body; a first vertical flow path which is formed in a vertical shape by passing through the inside of the block body from one surface of the block body; a first horizontal flow path which is formed in a horizontal shape by passing through the inside of the block body from a first point on a side surface of the block body and passes through one portion of the first vertical flow path; a second horizontal flow path which is formed in a horizontal shape by passing through the inside of the block body from a second point on the side surface of the block body and passes through another portion of the first vertical flow path; a second vertical flow path which is formed in a vertical shape by passing through the inside of the block body from a third point on the other surface of the block body and passes through the first horizontal flow path and the second horizontal flow path; a first sealing stopper provided at the first point so that a refrigerant, having passed through the first vertical flow path, can branch into the first horizontal flow path and the second horizontal flow path and then merge into the second vertical flow path; and a second sealing stopper provided at the second point.

Also, the cooling block according to the present invention may further include a third horizontal flow path which is formed in a horizontal shape by passing through the inside of the block body from a fourth point on the side surface of the block body and passes through the second vertical flow path; a third vertical flow path which is formed in a vertical shape by passing through the inside of the block body from the other surface of the block body and passes through the third horizontal flow path; a third sealing stopper provided at the third point such that the refrigerant in the second vertical flow path can pass through the third horizontal flow path and be guided to the third vertical flow path; and a fourth sealing stopper provided at the fourth point such that the refrigerant in the second vertical flow path can pass through the third horizontal flow path and be guided to the third vertical flow path.

In addition, the cooling block according to the present invention may further include a fourth horizontal flow path which is formed in a horizontal shape by passing through the inside of the block body from a fifth point on the side surface of the block body and passes through the other portion of the first vertical flow path; and a fifth sealing stopper provided at the fifth point such that the refrigerant, having passed through the first vertical flow path, can branch into the first horizontal flow path, the second horizontal flow path, and the fourth horizontal flow path and then merge into the second vertical flow path.

A plasma reactor according to the present invention for solving the above problems may include a reactor body having a gas inlet formed at one side and a plasma outlet formed at the other side, having an annular loop space formed therein, and having a body cooling passage formed therein; a magnetic core formed in a shape surrounding at least a portion of the reactor body and having a primary winding to generate a plasma by exciting a gas in the annular loop space; a cooling block provided outside the reactor body or the magnetic core, making thermal contact with the reactor body or the magnetic core, and having a block cooling passage formed therein; a connecting block having a first inlet pipe and a first outlet pipe formed on one side thereof to allow cooling water of a first temperature to be supplied and having a second inlet pipe and a second outlet pipe formed on the other side thereof to cooling water of a second temperature that is higher than the first temperature to be collected; and a cooling water circulation line provided between each of the connecting block, the cooling block, and the reactor body such that the cooling water introduced through the connection block can pass through the block cooling passage of the cooling block, then pass through the body cooling passage of the reactor body, and then be collected in the connecting block, wherein in the cooling block, a plurality of flow paths vertically or horizontally connected to each other may be formed in an integrated body and a stopper may be provided to allow a refrigerant to flow along the flow paths without leaking to the outside.

In addition, according to the present invention, the cooling block may include a front block provided in front of the reactor body or in front of the magnetic core; and a rear block provided in the rear of the reactor body or in the rear of the magnetic core.

Further, according to the present invention, the cooling water circulation line may include a first cooling line having one end connected to the first outlet pipe of the connecting block and the other end connected to a first block upper inlet of the front block; a second cooling line having one end connected to the first outlet pipe and the other end connected to a second block upper inlet of the rear block; a third cooling line having one end connected to a first block lower outlet of the front block and the other end connected to a first body lower inlet of the reactor body; a fourth cooling line having one end connected to a second block lower outlet of the rear block and the other end connected to a second body lower inlet of the reactor body; a fifth cooling line having one end connected to a third body upper outlet of the reactor body and the other end connected to the second inlet pipe of the connecting block; and a sixth cooling line having one end connected to a fourth body upper outlet of the reactor body and the other end connected to the second inlet pipe of the connecting block.

In addition, according to the present invention, the rear block may include an integrated block body; a first vertical flow path which is formed in a vertical shape by passing through the inside of the block body from one surface of the block body; a first horizontal flow path which is formed in a horizontal shape by passing through the inside of the block body from a first point on a side surface of the block body and passes through one portion of the first vertical flow path; a second horizontal flow path which is formed in a horizontal shape by passing through the inside of the block body from a second point on the side surface of the block body and passes through another portion of the first vertical flow path; a second vertical flow path which is formed in a vertical shape by passing through the inside of the block body from a third point on the other surface of the block body and passes through the first horizontal flow path and the second horizontal flow path; a first sealing stopper provided at the first point so that a refrigerant, having passed through the first vertical flow path, can branch into the first horizontal flow path and the second horizontal flow path and then merge into the second vertical flow path; a second sealing stopper provided at the second point; a third horizontal flow path which is formed in a horizontal shape by passing through the inside of the block body from a fourth point on the side surface of the block body and passes through the second vertical flow path; a third vertical flow path which is formed in a vertical shape by passing through the inside of the block body from the other surface of the block body and passes through the third horizontal flow path; a third sealing stopper provided at the third point such that the refrigerant in the second vertical flow path can pass through the third horizontal flow path and be guided to the third vertical flow path; and a fourth sealing stopper provided at the fourth point such that the refrigerant in the second vertical flow path can pass through the third horizontal flow path and be guided to the third vertical flow path.

Further, according to the present invention, the front block may include an integrated block body; a first vertical flow path which is formed in a vertical shape by passing through the inside of the block body from one surface of the block body; a first horizontal flow path which is formed in a horizontal shape by passing through the inside of the block body from a first point on a side surface of the block body and passes through one portion of the first vertical flow path; a second horizontal flow path which is formed in a horizontal shape by passing through the inside of the block body from a second point on the side surface of the block body and passes through another portion of the first vertical flow path; a second vertical flow path which is formed in a vertical shape by passing through the inside of the block body from a third point on the other surface of the block body and passes through the first horizontal flow path and the second horizontal flow path; a first sealing stopper provided at the first point so that a refrigerant, having passed through the first vertical flow path, can branch into the first horizontal flow path and the second horizontal flow path and then merge into the second vertical flow path; a second sealing stopper provided at the second point; a fourth horizontal flow path which is formed in a horizontal shape by passing through the inside of the block body from a fifth point on the side surface of the block body and passes through the other portion of the first vertical flow path; and a fifth sealing stopper provided at the fifth point such that the refrigerant, having passed through the first vertical flow path, can branch into the first horizontal flow path, the second horizontal flow path, and the fourth horizontal flow path and then merge into the second vertical flow path.

Advantageous Effects

According to a cooling block and a plasma reactor having the same in accordance with one embodiment of the present invention, a flow path in a complicated shape may be easily fabricated in one piece by forming vertical or horizontal flow paths in the integrated single block body through gun drilling or the like and blocking an unnecessary part with a stopper, so that the manufacturing cost and time can be greatly reduced. Also, refrigerant leaks may be prevented by using a stopper with excellent sealing capability instead of a sealing member. In addition, separate fixtures are not required due to the integrated shape, and thus manufacturing processes or time and costs can be further reduced and the heat transfer efficiency can be greatly increased since a boundary phenomenon does not occur.

Further, according to the present invention, the flow of cooling water may be primarily induced downward in a cooling block of a relatively low temperature so as to be opposite to thermal convection and the flow of the cooling water may be secondarily induced upward in a reactor body of a relatively high temperature so as to conform to thermal convection, so that the cooling efficiency can be maximized. In a standby mode, the flow rate of the cooling water may be reduced, the temperature of the cooling water may be raised, or the pressure may be reduced to prevent overcooling of the reactor body or the magnetic core, thereby preventing the generation of particles and increasing the plasma ignition rate and retention rate. Also, flow paths are formed in the cooling block to fundamentally block the possibility of leakage of cooling water. It should be noted that the scope of the present invention is not limited to the effects described above.

BEST MODE FOR INVENTION

Figure 1:
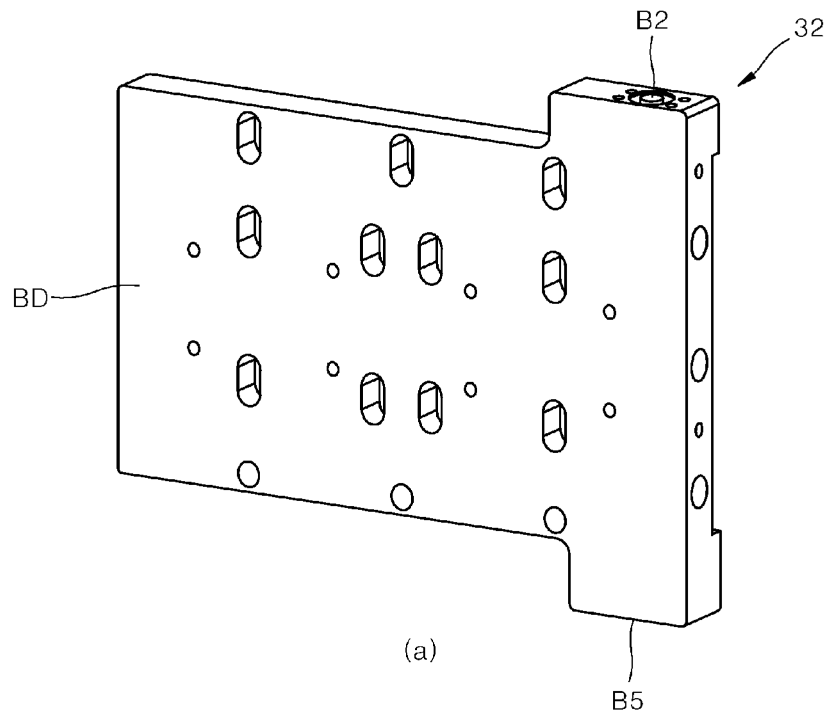
FIG. 1 shows a perspective view (a) and a perspective view (b) illustrating a cooling block according to some embodiments of the present invention.
Figure 1:
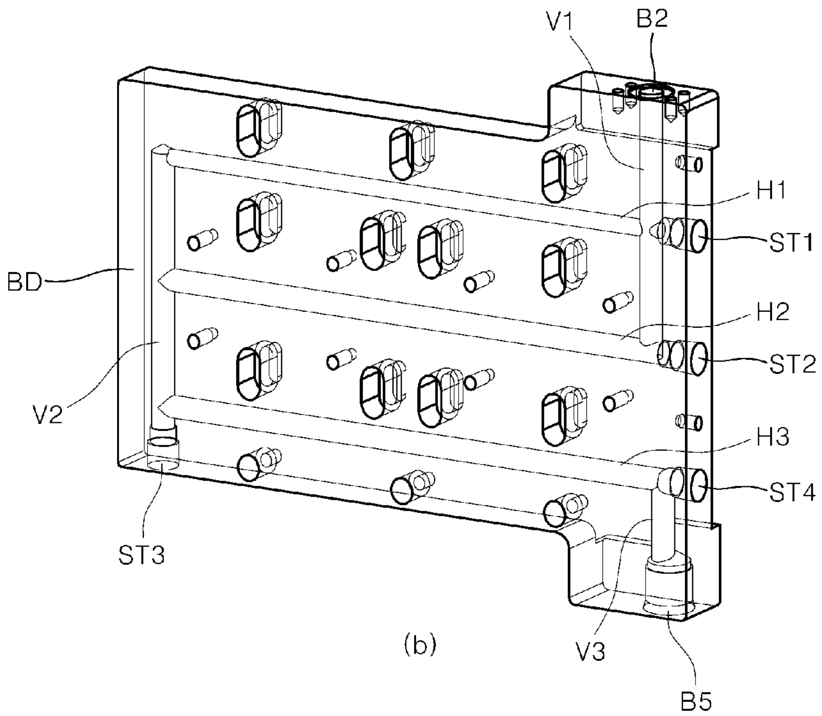

Hereinafter, several preferred embodiments of the present invention will be described in detail with reference to the accompanying drawings.

The embodiments of the present invention are provided for more fully describing the present invention to those skilled in the art, and the embodiments below may be modified in various forms, and the scope of the present invention is not limited to the embodiments below. Rather, these embodiments are provided such that this disclosure will be thorough and complete and will fully convey the spirit of the present invention to those skilled in the art. Further, in the drawings, a thickness or a size of each layer is exaggerated for convenience and clarity of description.

FIG. 1 shows a perspective view (a) and a perspective view (b) illustrating a cooling block according to some embodiments of the present invention.

As shown in FIG. 1, a cooling block (a rear block 32 to be described below) according to some embodiments of the present invention may include an integrated block body BD fabricated as one piece, a first vertical flow path V1 which is formed in a vertical shape by passing through the inside of the block body BD from one surface of the block body BD, a first horizontal flow path H1 which is formed in a horizontal shape by passing through the inside of the block body BD from a first point on a side surface of the block body BD and passes through one portion of the first vertical flow path V1, a second horizontal flow path H2 which is formed in a horizontal shape by passing through the inside of the block body BD from a second point on the side surface of the block body BD and passes through the other portion of the first vertical flow path V1, a second vertical flow path V2 which is formed in a vertical shape by passing through the inside of the block body BD from a third point on the other surface of the block body BD and passes through the first horizontal flow path H1 and the second horizontal flow path H2, a first sealing stopper ST1 provided at the first point so that a refrigerant, having passed through the first vertical flow path V1, can branch into the first horizontal flow path H1 and the second horizontal flow path H2 and then merge into the second vertical flow path V2, a second sealing stopper ST2 provided at the second point, a third horizontal flow path H3 which is formed in a horizontal shape by passing through the inside of the block body BD from a fourth point on the side surface of the block body BD and passes through the second vertical flow path V2, a third vertical flow path V3 which is formed in a vertical shape by passing through the inside of the block body BD from the other surface of the block body BD and passes through the third horizontal flow path H3, a third sealing stopper ST3 provided at the third point such that the refrigerant in the second vertical flow path V2 can pass through the third horizontal flow path H3 and be guided to the third vertical flow path V3, and a fourth sealing stopper ST4 provided at the fourth point such that the refrigerant in the second vertical flow path V2 can pass through the third horizontal flow path H3 and be guided to the third vertical flow path V3.

Accordingly, as shown in (b) of FIG. 1, the refrigerant that has passed through the first vertical flow path part V1 may branch into two flow paths, i.e., the first horizontal flow path H1 and the second horizontal flow path H2, and then merge into the second vertical flow path part V2.

Therefore, a flow path in a complicated shape may be easily fabricated in one piece by forming vertical or horizontal flow paths in the integrated single block body through gun drilling or the like and blocking an unnecessary part with a stopper, so that the manufacturing cost and time can be greatly reduced. Also, refrigerant leaks may be prevented by using a stopper with excellent sealing capability instead of a sealing member. In addition, separate fixtures are not required due to the integrated shape, and thus manufacturing processes or time and costs can be further reduced and the heat transfer efficiency can be greatly increased since a boundary phenomenon does not occur.

Figure 2:
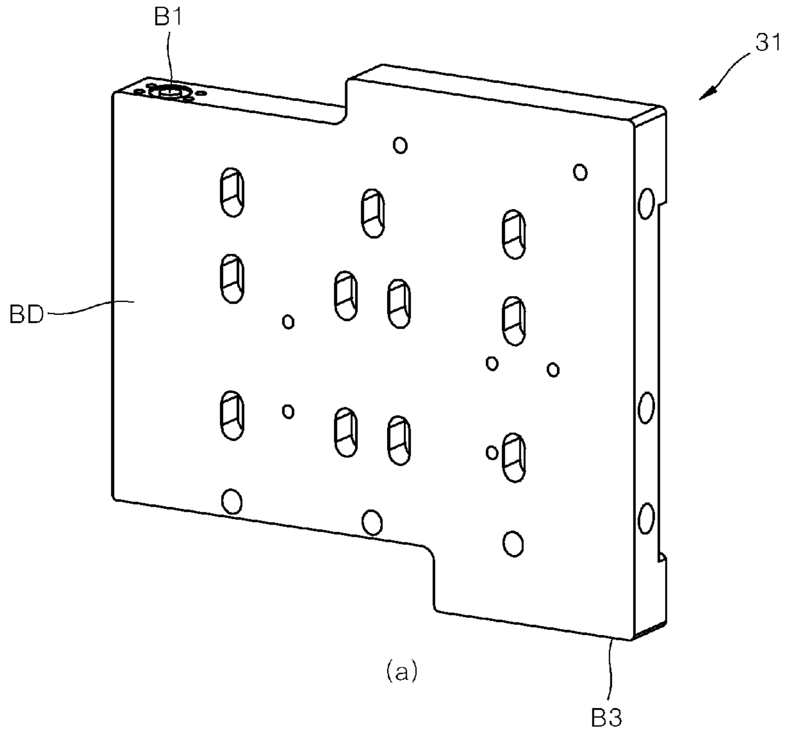
FIG. 2 shows a perspective view (a) and a perspective view (b) illustrating a cooling block according to some other embodiments of the present invention.
Figure 2:
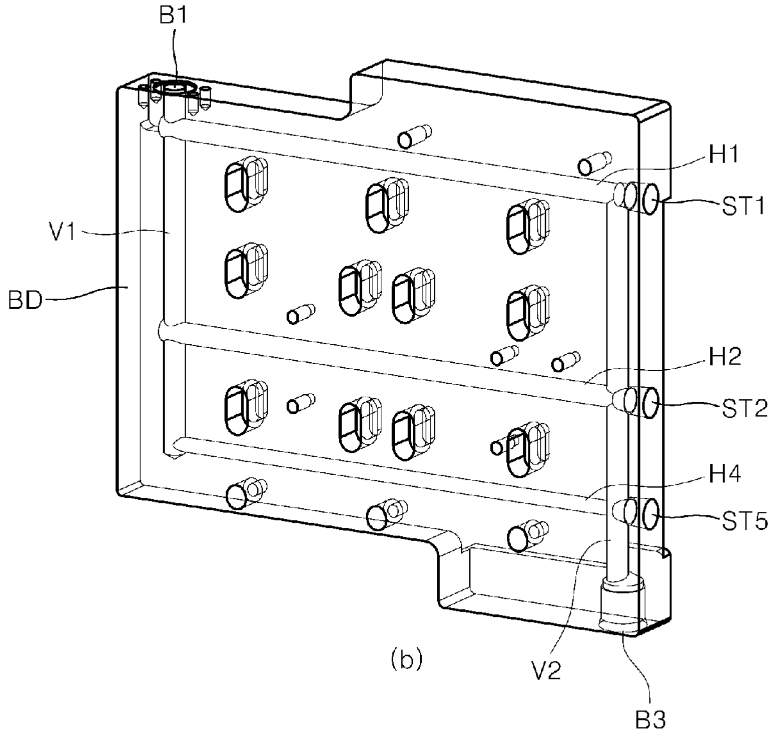

FIG. 2 shows a perspective view (a) and a perspective view (b) illustrating a cooling block according to some other embodiments of the present invention.

As shown in FIG. 2, the cooling block (front block 31 to be described below) according to some other embodiments of the present invention may include an integrated block body BD fabricated as one piece, a first vertical flow path V1 which is formed in a vertical shape by passing through the inside of the block body BD from one surface of the block body BD, a first horizontal flow path H1 which is formed in a horizontal shape by passing through the inside of the block body BD from a first point on a side surface of the block body BD and passes through one portion of the first vertical flow path V1, a second horizontal flow path H2 which is formed in a horizontal shape by passing through the inside of the block body BD from a second point on the side surface of the block body BD and passes through another portion of the first vertical flow path V1, a second vertical flow path V2 which is formed in a vertical shape by passing through the inside of the block body BD from a third point on the other surface of the block body BD and passes through the first horizontal flow path H1 and the second horizontal flow path H2, a first sealing stopper ST1 provided at the first point so that a refrigerant, having passed through the first vertical flow path V1, can branch into the first horizontal flow path H1 and the second horizontal flow path H2 and then merge into the second vertical flow path V2, a second sealing stopper ST2 provided at the second point, a fourth horizontal flow path H4 which is formed in a horizontal shape by passing through the inside of the block body BD from a fifth point on the side surface of the block body BD and passes through the other portion of the first vertical flow path V1, and a fifth sealing stopper ST5 provided at the fifth point such that the refrigerant, having passed through the first vertical flow path V1, can branch into the first horizontal flow path H1, the second horizontal flow path H2, and the fourth horizontal flow path H4 and then merge into the second vertical flow path V2.

Accordingly, the refrigerant that has passed through the first vertical flow path part V1 may branch into the first horizontal flow path part H1, the second horizontal flow path part H2, and the fourth horizontal flow path part H4 and then merge into the second vertical flow path V2.

Here, the rear block 32 of FIG. 1 may apply to a case where a second block upper inlet B2 and a second block lower outlet B5 are both positioned toward the right of the integrated block body BD, and the front block 31 of FIG. 2 may apply to a case where a first block upper inlet B1 is positioned toward the left of the integral block body BD and a first block lower outlet B3 is positioned toward the right of the integrated block body BD. Thus, the use of these two blocks 31 and 32 allows the refrigerant to flow uniformly to the side of a heating element even at the inlet and outlet at various locations.

Figure 3:
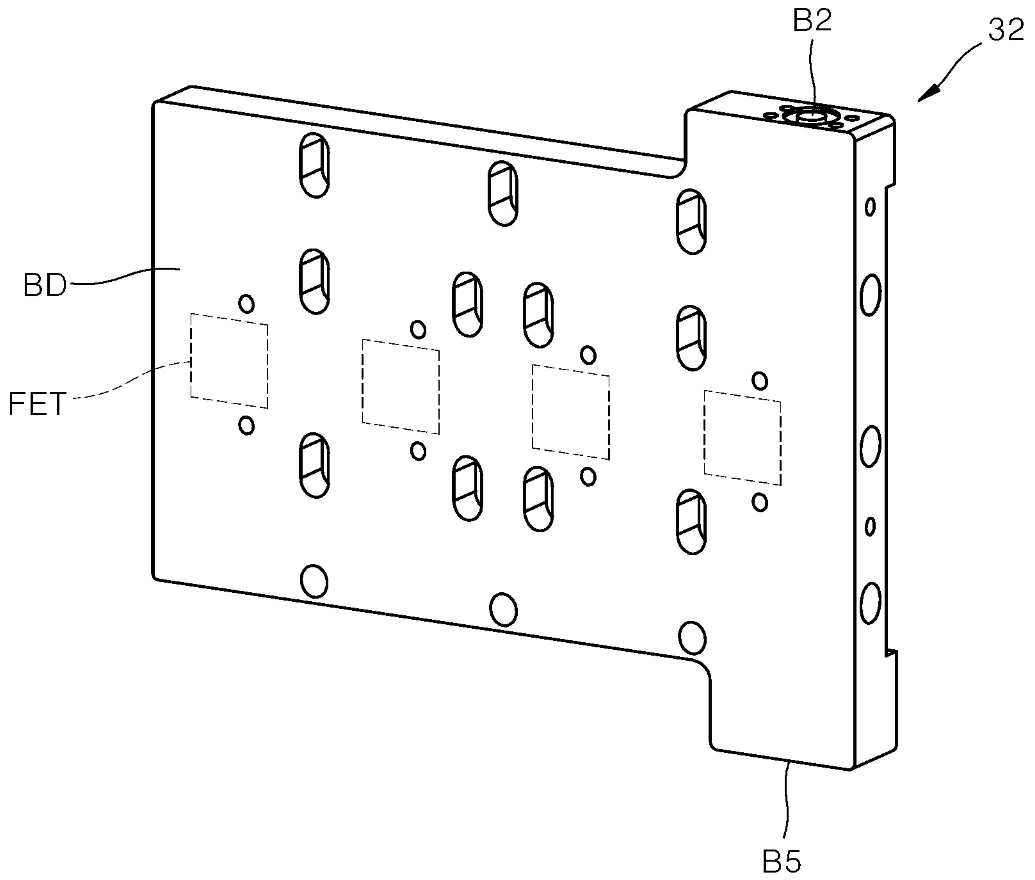
FIG. 3 is a perspective view illustrating a cooling block according to some other embodiments of the present invention.

More specifically, FIG. 3 is a perspective view illustrating an exterior of a plasma reactor 100 according to some embodiments of the present disclosure. In addition, FIG. 4 is a fluid circuit diagram illustrating a cooling water circulation state of the plasma reactor of FIG. 3.

Figure 4:
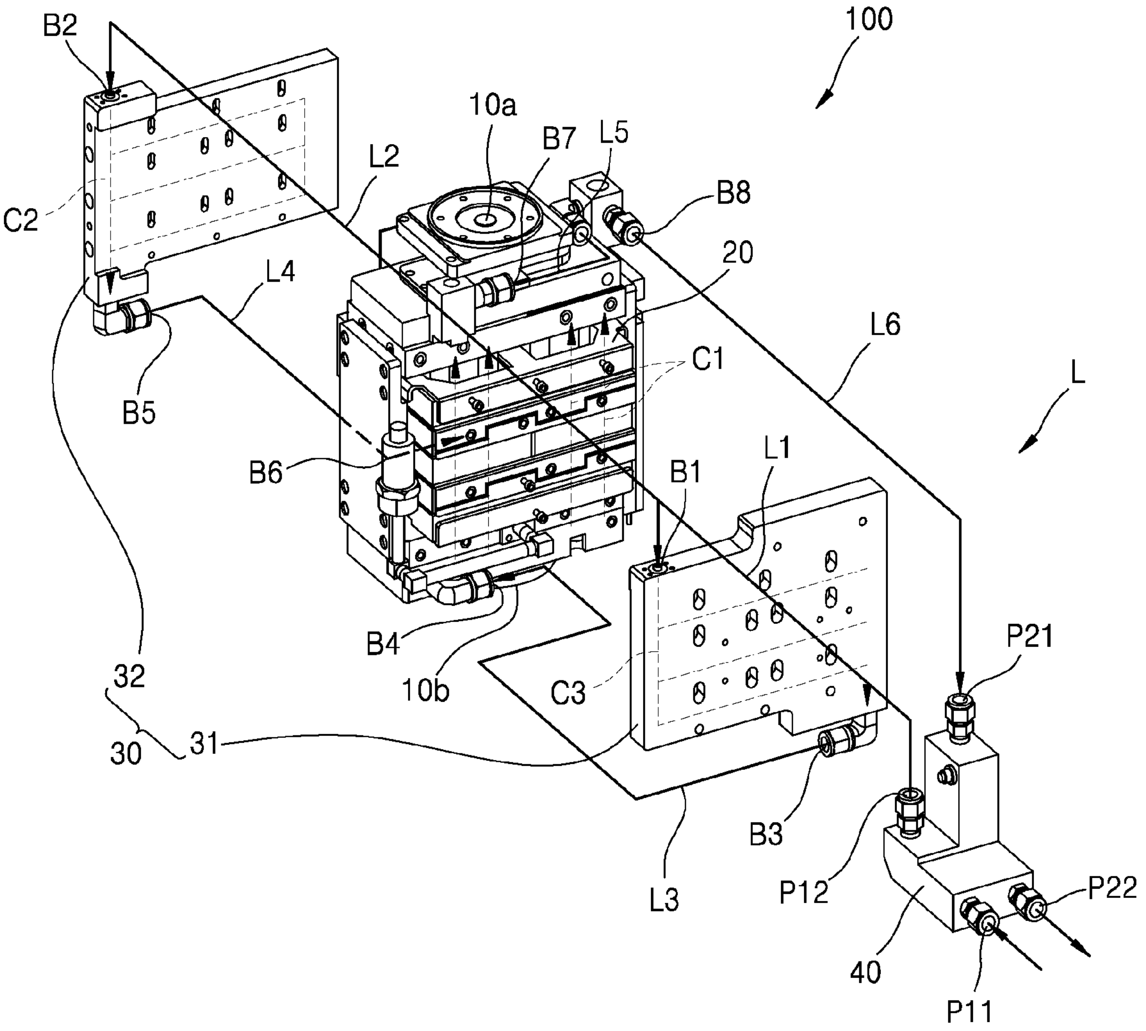
FIG. 4 is a perspective view illustrating an exterior of a plasma reactor according to some embodiments of the present invention.

As shown in FIGS. 3 and 4, the plasma reactor 100 according to some embodiments of the present invention may largely include a reactor body 10, a magnetic core 20, a cooling block 30, a connecting block 40, and a cooling water circulation line L.

For example, as shown in FIGS. 3 and 4, the reactor body 10 may be a toroidal remote plasma generator (RPG), that is, a transformer-coupled RPG with a gas inlet 10*a* formed at one side and a plasma outlet 10*b* formed at the other side, which has an annular loop space formed therein and has a body cooling passage C1 formed to allow process-cooling water (PCW) to flow therein.

Also, for example, as shown in FIG. 3, the reactor body 10 may include a first portion (upper portion) formed in a portion of the reactor body 10 and a second portion (lower portion) formed in the other portion of the reactor body 10 corresponding to the first portion so that an ignition electromotive force is formed.

The reactor body 10 may be formed of the first portion and the second portion described above, i.e., two pieces, to form an ignition electromotive force or a retaining electromotive force to ignite plasma discharge between the first portion and the second portion of the reactor body 10 and maintain the plasma.

That is, the first portion may be an upper branch pipe formed on an upper portion of the reactor body 10 and the second portion may be a lower branch pipe formed on a lower portion of the reactor body 10. Although not illustrated, a separate insulating member or a sealing member may be provided between the upper branch pipe and the lower branch pipe.

Accordingly, a cleaning gas or an exhaust gas before purification is introduced into the reactor body 10 through an inlet of the first portion, the plasma may be ionized or the exhaust gas may be purified inside the reactor body 10, and then the cleaning gas or the purified exhaust gas may be discharged through an outlet of the second portion.

That is, the plasma reactor 100 of the present invention may be used for the purpose of cleaning a process chamber or purifying the exhaust gas.

Meanwhile, as shown in FIGS. 3 and 4, the magnetic core 20 may be formed in a shape surrounding at least a portion of the reactor body 10, and may be a structure having a primary winding (not shown) to generate a plasma by exciting the gas in the annular loop space.

Accordingly, in the operation process of the plasma reactor 100 according to some embodiments of the present invention, when an induced electromotive force is formed in the magnetic core 20 by the primary winding, an annular plasma discharge loop may be generated in the reactor body 10. Here, a separate reactant gas may be supplied into the reactor body 10.

At this time, when the reactant gas or the exhaust gas of various chambers (not shown) is introduced into the reactor body 10, the gas is applied plasma energy and is excited to a plasma state or harmful components may be burnt or purified due to a reaction such as oxidation.

Here, the chambers may include, for example, an ashing chamber for removing a photoresist, a chemical vapor deposition (CVD) chamber configured to deposit an insulating film, and an etching chamber configured to etch apertures or openings on the insulating film to form interconnection structures. Alternatively, the chambers may include a physical vapor deposition (PVD) chamber configured to deposit a barrier film or a PVD chamber configured to deposit a metal film.

Meanwhile, for example, as shown in FIGS. 3 and 4, the cooling block 30 may be provided outside the reactor body 10 or the magnetic core 20, and be in thermal contact with the reactor body 10 or the magnetic core 20, and be a structure in which a block cooling passage C2 is formed.

More specifically, for example, as shown in FIGS. 3 and 4, the cooling block 30 may include the front block 31 provided in front of the reactor body 10 or in front of the magnetic core 20 and the rear block 32 provided in the rear of the reactor body 10 or in the rear of the magnetic core 20.

In particular, as shown in FIG. 1, the rear block 32 may include an integrated block body BD fabricated as one piece, a first vertical flow path V1 which is formed in a vertical shape by passing through the inside of the block body BD from one surface of the block body BD, a first horizontal flow path H1 which is formed in a horizontal shape by passing through the inside of the block body BD from a first point on a side surface of the block body BD and passes through one portion of the first vertical flow path V1, a second horizontal flow path H2 which is formed in a horizontal shape by passing through the inside of the block body BD from a second point on the side surface of the block body BD and passes through the other portion of the first vertical flow path V1, a second vertical flow path V2 which is formed in a vertical shape by passing through the inside of the block body BD from a third point on the other surface of the block body BD and passes through the first horizontal flow path H1 and the second horizontal flow path H2, a first sealing stopper ST1 provided at the first point so that a refrigerant, having passed through the first vertical flow path V1, can branch into the first horizontal flow path H1 and the second horizontal flow path H2 and then merge into the second vertical flow path V2, a second sealing stopper ST2 provided at the second point, a third horizontal flow path H3 which is formed in a horizontal shape by passing through the inside of the block body BD from a fourth point on the side surface of the block body BD and passes through the second vertical flow path V2, a third vertical flow path V3 which is formed in a vertical shape by passing through the inside of the block body BD from the other surface of the block body BD and passes through the third horizontal flow path H3, a third sealing stopper ST3 provided at the third point such that the refrigerant in the second vertical flow path V2 can pass through the third horizontal flow path H3 and be guided to the third vertical flow path V3, and a fourth sealing stopper ST4 provided at the fourth point such that the refrigerant in the second vertical flow path V2 can pass through the third horizontal flow path H3 and be guided to the third vertical flow path V3.

In addition, particularly, as shown in FIG. 2, the front block 31 may include an integrated block body BD fabricated as one piece, a first vertical flow path V1 which is formed in a vertical shape by passing through the inside of the block body BD from one surface of the block body BD, a first horizontal flow path H1 which is formed in a horizontal shape by passing through the inside of the block body BD from a first point on a side surface of the block body BD and passes through one portion of the first vertical flow path V1, a second horizontal flow path H2 which is formed in a horizontal shape by passing through the inside of the block body BD from a second point on the side surface of the block body BD and passes through another portion of the first vertical flow path V1, a second vertical flow path V2 which is formed in a vertical shape by passing through the inside of the block body BD from a third point on the other surface of the block body BD and passes through the first horizontal flow path H1 and the second horizontal flow path H2, a first sealing stopper ST1 provided at the first point so that a refrigerant, having passed through the first vertical flow path V1, can branch into the first horizontal flow path H1 and the second horizontal flow path H2 and then merge into the second vertical flow path V2, a second sealing stopper ST2 provided at the second point, a fourth horizontal flow path H4 which is formed in a horizontal shape by passing through the inside of the block body BD from a fifth point on the side surface of the block body BD and passes through the other portion of the first vertical flow path V1, and a fifth sealing stopper ST5 provided at the fifth point such that the refrigerant, having passed through the first vertical flow path V1, can branch into the first horizontal flow path H1, the second horizontal flow path H2, and the fourth horizontal flow path H4 and then merge into the second vertical flow path V2.

Accordingly, the cooling block 20 may make thermal contact with the outer surface of the reactor body 10 or the magnetic core 20 to facilitate heat exchange.

Meanwhile, as shown in FIGS. 3 and 4, the connecting block 40 may be a structure having a first inlet pipe P11 and a first outlet pipe P12 formed on one side thereof to allow cooling water of a first temperature to be supplied and a second inlet pipe P21 and a second outlet pipe P22 formed on the other side thereof to allow cooling water of a second temperature that is higher than the first temperature to be collected.

Accordingly, considering the fact that the cooling water is a fluid, the above-described first inlet pipe P11, the first outlet pipe P12, the second inlet pipe P21, and the second outlet pipe P22 may be formed on a single block body of the connecting block 40 such that the flow rate, temperature, and pressure of the cooling water can be simultaneously measured at the same place.

FIG. 3 is a perspective view illustrating a cooling block 32 according to some other embodiments of the present invention.

As shown in FIG. 3, the cooling block 32 according to some other embodiments of the present invention may serve as a kind of heat sink for cooling a switching element (e.g., field effect transistor (FET)) indicated by a dotted line.

Here, the switching element (e.g., FET) may be cooled by using simply an O-ring, but when the cooling block of the present invention is used, an experimental measurement result shows that the cooling efficiency is improved by approximately 7.7% compared to the method of simply using the O-ring.

Figure 5:
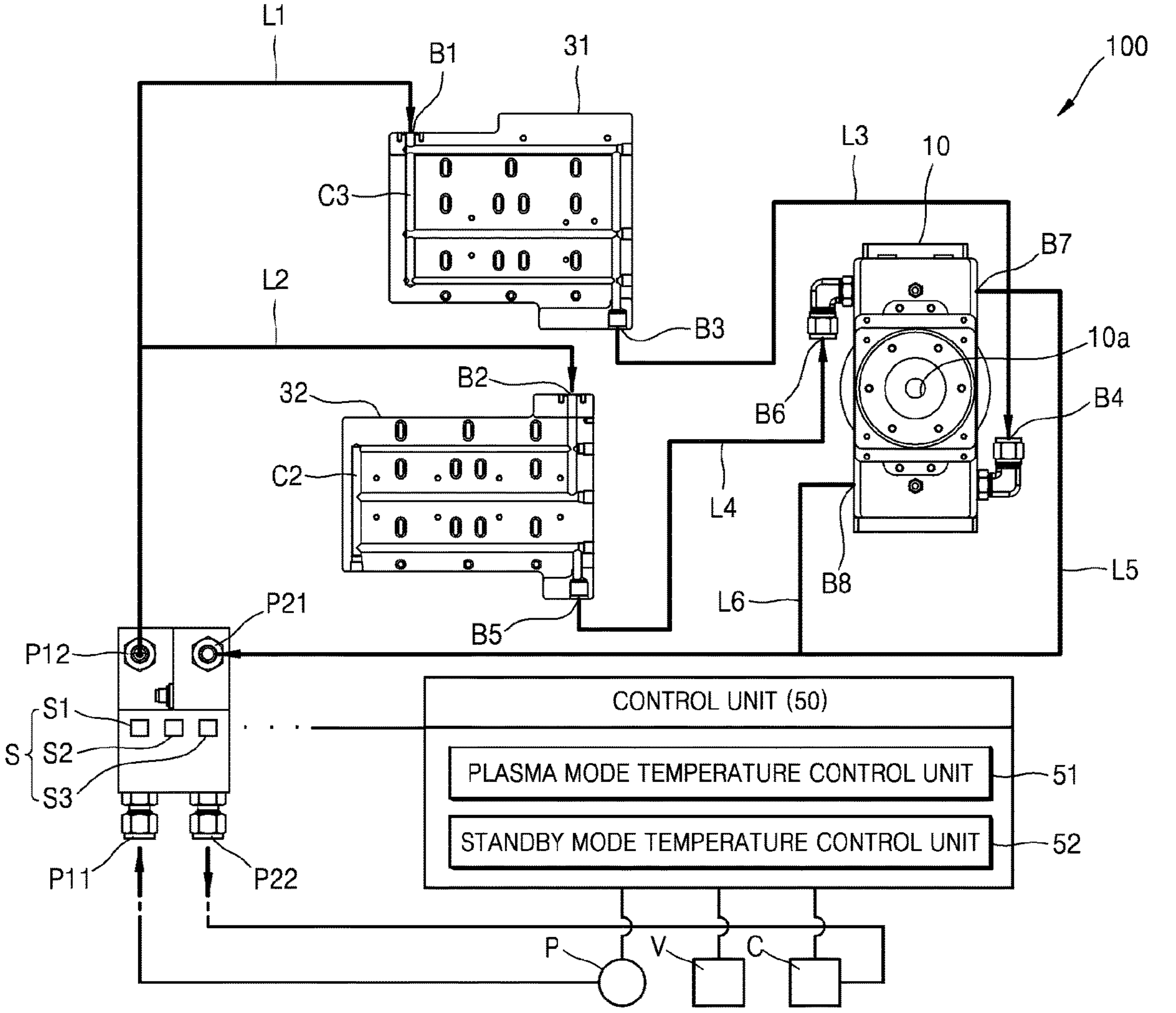
FIG. 5 is a fluid circuit diagram illustrating a cooling water circulation state of the plasma reactor of FIG. 3.

On the other hand, as shown in FIGS. 4 and 5, the cooling water circulation line (L) may be a cooling water circulation pipe or a cooling water circulation hose or tube provided between each of the connecting block 40, the cooling block 30, and the reactor body 10 such that the cooling water introduced through the connection block 40 can pass through the block cooling passages C2 and C3, then pass through the body cooling passage C1 of the reactor body 10, and then be collected in the connecting block 40.

More specifically, for example, as shown in FIGS. 4 and 5, the cooling water circulation line L may include a first cooling line L1 having one end connected to the first outlet pipe P12 of the connecting block 40 and the other end connected to the first block upper inlet B1 of the block cooling passage C3 of the front block 31, a second cooling line having one end connected to the first outlet pipe P12 and the other end connected to the second block upper inlet B2 of the block cooling passage C2 of the rear block 32, a third cooling line L3 having one end connected to the first block lower outlet B3 of the front block 31 and the other end connected to the first body lower inlet B4 of the reactor body 10, a fourth cooling line L4 having one end connected to the second block lower outlet B5 of the rear block 32 and the other end connected to a second body lower inlet B6 of the reactor body 10, a fifth cooling line L5 having one end connected to a third body upper outlet B7 of the reactor body 10 and the other end connected to the second inlet pipe P21 of the connecting block 40, and a sixth cooling line L6 having one end connected to a fourth body upper outlet B8 of the reactor body 10 and the other end connected to the second inlet pipe P21 of the connecting block 40.

Therefore, the above-described cooling water circulation line L may allow the cooling water to flow from the upper portion to the lower portion of the cooling block 30 to cause primary heat exchange, then may allow the cooling water to flow from the lower portion to the upper portion of the reactor body 10 to cause secondary heat exchange, and may circulate the cooling water collected using the connecting block 40.

Accordingly, the flow of the cooling water may be primarily induced downward in the cooling block 30 of a relatively low temperature so as to be opposite to thermal convection, and the flow of the cooling water may be secondarily induced upward in the reactor body 10 of a relatively high temperature so as to conform to thermal convection.

Meanwhile, as shown in FIG. 5, the plasma reactor 100 according to some embodiments of the present invention may further include a measurement sensor S provided in the connecting block 40 and configured to select and measure at least one of the flow rate, temperature, pressure of the cooling water, or a combination thereof, and a control unit 50 configured to receive a measurement signal from the measurement sensor S and select and output at least one of a flow control signal, a temperature control signal, and a pressure control signal for the cooling water, or a combination thereof.

More specifically, for example, the measurement sensor S may be formed by selecting at least one of a flow rate sensor S1 provided in the connecting block 40 and capable of measuring a flow rate of the cooling water, a temperature sensor S2 capable of measuring a temperature of the cooling water, a pressure sensor S3 capable of measuring a pressure of the cooling water, or a combination thereof.

In addition, as shown in FIG. 5, the control unit 50 may include a plasma mode temperature control unit 51 capable of controlling the reactor body 10 or the magnetic core 20 to a plasma mode temperature when plasma is generated, and a standby mode temperature control unit 52 capable of controlling the reactor body 10 or the magnetic core 20 to a standby mode temperature during standby.

More specifically, for example, the plasma mode temperature control unit 51 may select and output at least one of a first flow control signal to control the flow rate of the cooling water to a first flow rate, a first temperature control signal to control the temperature of the cooling water to a first temperature, a first pressure control signal to control the pressure of the cooling water to a first pressure, or a combination thereof, so as to prevent overheating of the reactor body 10 or the magnetic core 20 when a plasma is generated.

Also, the standby mode temperature control unit 52 may select and output at least one of a second flow control signal to control the flow rate of the cooling water to a second flow rate that is less than the first flow rate, a second temperature control signal to control the temperature of the cooling water to a second temperature that is higher than the first temperature, a second pressure control signal to control the pressure of the cooling water to a second pressure that is lower than the first pressure, or a combination thereof, so as to prevent overcooling of the reactor body 10 or the magnetic core 20 during standby.

Here, the control units may be formed in the form of various electronic components such as a microprocessor, a central processing unit (CPU), a substrate, or the like, various circuits, various programs, or electrical signals, and detailed descriptions thereof will not be provided.

In addition, as shown in FIG. 5, for example, the second flow rate control signal may be applied to a flow control valve V, the second temperature control signal may be applied to a chiller or cooling device C for cooling the cooling water, and the second pressure control signal may be applied to a hydraulic pump P.

Thus, in a standby mode in which a plasma is not generated, as there is no plasma heating source, the flow rate of the cooling water may be reduced, the temperature of the cooling water may be raised, or the pressure may be reduced to prevent overcooling of the reactor body or the magnetic core, thereby preventing the generation of particles and increasing the plasma ignition rate and retention rate.

Meanwhile, a method of cooling a plasma reactor according to some embodiments of the present invention may be a method that uses the above-described plasma reactor 100 in which the cooling water is flowed from the upper portion to the lower portion of the cooling block 30 to cause primary heat exchange, the cooling water is then flowed from the lower portion to the upper portion of the reactor body 10 to cause secondary heat exchange, and the cooling water collected using the connecting block 40 is circulated.

Hence, since all flows of the cooling water cannot be directed only upward, the cooling water may be flowed downward at a low temperature and be flowed upward at a high temperature to take the best advantage of thermal convection, thereby maximizing the cooling efficiency.

While one or more exemplary embodiments of the present invention have been described with reference to the figures, it will be understood by one of ordinary skill in the art that various changes in form and details may be made therein without departing from the spirit and scope of the present disclosure.

INDUSTRIAL APPLICABILITY

According to a cooling block and a plasma reactor having the same in accordance with one embodiment of the present invention, a flow path in a complicated shape may be easily fabricated in one piece by forming vertical or horizontal flow paths in the integrated single block body through gun drilling or the like and blocking an unnecessary part with a stopper, so that the manufacturing cost and time can be greatly reduced. Also, refrigerant leaks may be prevented by using a stopper with excellent sealing capability instead of a sealing member. In addition, separate fixtures are not required due to the integrated shape, and thus manufacturing processes or time and costs can be further reduced and the heat transfer efficiency can be greatly increased since a boundary phenomenon does not occur.

The invention claimed is:

1. A cooling block comprising:

an integrated block body;

a first vertical flow path which is formed in a vertical shape by passing through an inside of the block body from one surface of the block body;

a first horizontal flow path which is formed in a horizontal shape by passing through the inside of the block body from a first point on a side surface of the block body and passes through one portion of the first vertical flow path;

a second horizontal flow path which is formed in a horizontal shape by passing through the inside of the block body from a second point on the side surface of the block body and passes through another portion of the first vertical flow path;

a second vertical flow path which is formed in a vertical shape by passing through the inside of the block body from a third point on an other surface of the block body and passes through the first horizontal flow path and the second horizontal flow path;

a first sealing stopper provided at the first point so that a refrigerant, having passed through the first vertical flow path, can branch into the first horizontal flow path and the second horizontal flow path and then merge into the second vertical flow path; and a second sealing stopper provided at the second point.

2. The cooling block of claim 1, further comprising:

a third horizontal flow path which is formed in a horizontal shape by passing through the inside of the block body from a fourth point on the side surface of the block body and passes through the second vertical flow path;

a third vertical flow path which is formed in a vertical shape by passing through the inside of the block body from the other surface of the block body and passes through the third horizontal flow path;

a third sealing stopper provided at the third point such that the refrigerant in the second vertical flow path can pass through the third horizontal flow path and be guided to the third vertical flow path; and a fourth sealing stopper provided at the fourth point such that the refrigerant in the second vertical flow path can pass through the third horizontal flow path and be guided to the third vertical flow path.

3. The cooling block of claim 1, further comprising:

a fourth horizontal flow path which is formed in a horizontal shape by passing through the inside of the block body from a fifth point on the side surface of the block body and passes through an other portion of the first vertical flow path; and a fifth sealing stopper provided at the fifth point such that the refrigerant, having passed through the first vertical flow path, can branch into the first horizontal flow path, the second horizontal flow path, and the fourth horizontal flow path and then merge into the second vertical flow path.

4. A plasma reactor comprising:

a reactor body having a gas inlet formed at one side and a plasma outlet formed at an other side, having an annular loop space formed therein, and having a body cooling passage formed therein;

a magnetic core formed in a shape surrounding at least a portion of the reactor body and having a primary winding to generate a plasma by exciting a gas in the annular loop space;

a cooling block provided outside the reactor body or the magnetic core, making thermal contact with the reactor body or the magnetic core, and having a block cooling passage formed therein;

a connecting block having a first inlet pipe and a first outlet pipe formed on one side thereof to allow cooling water of a first temperature to be supplied and having a second inlet pipe and a second outlet pipe formed on the other side thereof to cooling water of a second temperature that is higher than the first temperature to be collected; and a cooling water circulation line provided between each of the connecting block, the cooling block, and the reactor body such that the cooling water introduced through the connection block can pass through the block cooling passage of the cooling block, then pass through the body cooling passage of the reactor body, and then be collected in the connecting block, wherein in the cooling block, a plurality of flow paths vertically or horizontally connected to each other are formed in an integrated body and a stopper is provided to allow a refrigerant to flow along the flow paths without leaking to the outside.

5. The plasma reactor of claim 4, wherein the cooling block comprises a front block provided in front of the reactor body or in front of the magnetic core; and a rear block provided in the rear of the reactor body or in the rear of the magnetic core.

6. The plasma reactor of claim 5, wherein the cooling water circulation line comprises:

a first cooling line having one end connected to the first outlet pipe of the connecting block and an other end connected to a first block upper inlet of the front block;

a second cooling line having one end connected to the first outlet pipe and an other end connected to a second block upper inlet of the rear block;

a third cooling line having one end connected to a first block lower outlet of the front block and an other end connected to a first body lower inlet of the reactor body;

a fourth cooling line having one end connected to a second block lower outlet of the rear block and an other end connected to a second body lower inlet of the reactor body;

a fifth cooling line having one end connected to a third body upper outlet of the reactor body and an other end connected to the second inlet pipe of the connecting block; and a sixth cooling line having one end connected to a fourth body upper outlet of the reactor body and an other end connected to the second inlet pipe of the connecting block.

7. The plasma reactor of claim 5, wherein the rear block comprises:

an integrated block body;

a first vertical flow path which is formed in a vertical shape by passing through an inside of the block body from one surface of the block body;

a first horizontal flow path which is formed in a horizontal shape by passing through the inside of the block body from a first point on a side surface of the block body and passes through one portion of the first vertical flow path;

a second horizontal flow path which is formed in a horizontal shape by passing through the inside of the block body from a second point on the side surface of the block body and passes through another portion of the first vertical flow path;

a second vertical flow path which is formed in a vertical shape by passing through the inside of the block body from a third point on an other surface of the block body and passes through the first horizontal flow path and the second horizontal flow path;

a first sealing stopper provided at the first point so that a refrigerant, having passed through the first vertical flow path, can branch into the first horizontal flow path and the second horizontal flow path and then merge into the second vertical flow path;

a second sealing stopper provided at the second point;

a third horizontal flow path which is formed in a horizontal shape by passing through the inside of the block body from a fourth point on the side surface of the block body and passes through the second vertical flow path;

a third vertical flow path which is formed in a vertical shape by passing through the inside of the block body from the other surface of the block body and passes through the third horizontal flow path;

a third sealing stopper provided at the third point such that the refrigerant in the second vertical flow path can pass through the third horizontal flow path and be guided to the third vertical flow path; and a fourth sealing stopper provided at the fourth point such that the refrigerant in the second vertical flow path can pass through the third horizontal flow path and be guided to the third vertical flow path.

8. The plasma reactor of claim 5, wherein the front block comprises:

an integrated block body;

a first vertical flow path which is formed in a vertical shape by passing through an inside of the block body from one surface of the block body;

a first horizontal flow path which is formed in a horizontal shape by passing through the inside of the block body from a first point on a side surface of the block body and passes through one portion of the first vertical flow path;

a second horizontal flow path which is formed in a horizontal shape by passing through the inside of the block body from a second point on the side surface of the block body and passes through another portion of the first vertical flow path;

a second vertical flow path which is formed in a vertical shape by passing through the inside of the block body from a third point on an other surface of the block body and passes through the first horizontal flow path and the second horizontal flow path;

a first sealing stopper provided at the first point so that a refrigerant, having passed through the first vertical flow path, can branch into the first horizontal flow path and the second horizontal flow path and then merge into the second vertical flow path;

a second sealing stopper provided at the second point;

a fourth horizontal flow path which is formed in a horizontal shape by passing through the inside of the block body from a fifth point on the side surface of the block body and passes through an other portion of the first vertical flow path; and a fifth sealing stopper provided at the fifth point such that the refrigerant, having passed through the first vertical flow path, can branch into the first horizontal flow path, the second horizontal flow path, and the fourth horizontal flow path and then merge into the second vertical flow path.

* * * * *